(12) United States Patent
Takahashi

(10) Patent No.: US 7,226,846 B2
(45) Date of Patent: Jun. 5, 2007

(54) METHOD OF DRY ETCHING SEMICONDUCTOR SUBSTRATE TO REDUCE CRYSTAL DEFECTS IN A TRENCH

(75) Inventor: Masahiro Takahashi, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 187 days.

(21) Appl. No.: 10/844,536

(22) Filed: May 13, 2004

(65) Prior Publication Data

US 2005/0148153 A1 Jul. 7, 2005

(30) Foreign Application Priority Data

Jan. 7, 2004 (JP) ............................. 2004-002408

(51) Int. Cl.
*H01L 21/762* (2006.01)
(52) U.S. Cl. .................. 438/425; 438/433; 438/524; 438/525
(58) Field of Classification Search ................ 438/433
See application file for complete search history.

(56) References Cited

U.S. PATENT DOCUMENTS

| | | | |
|---|---|---|---|
| 5,047,359 A * | 9/1991 | Nagatomo | 438/524 |
| 5,198,387 A * | 3/1993 | Tang | 438/684 |
| 5,807,784 A * | 9/1998 | Kim | 438/423 |
| 6,037,238 A | 3/2000 | Chang et al. | |
| 6,274,460 B1 | 8/2001 | Delgado et al. | |
| 6,514,833 B1 * | 2/2003 | Ishida et al. | 438/424 |
| 6,576,558 B1 * | 6/2003 | Lin et al. | 438/700 |
| 6,586,295 B2 | 7/2003 | Ohno | |
| 6,762,103 B2 * | 7/2004 | Kwak et al. | 438/296 |

FOREIGN PATENT DOCUMENTS

| | | | |
|---|---|---|---|
| JP | 01225350 A | * | 9/1989 |
| JP | 07-221111 | | 8/1995 |
| JP | 10-214844 | | 8/1998 |
| JP | 11-067682 | | 3/1999 |

OTHER PUBLICATIONS

Stanley Wolf and Richard N. Tauber, "Silicon Processing for the VLSI Era—vol. 1: Process Technology," Lattice Press, Sunset Beach, California (1986), pp. 1-6.*

Junichiro Kuno, "Production Method of Semiconductor Integrated Circuit Device," English Translation of JP 1-225350 A, JPO, Sep. 8, 1989.*

* cited by examiner

*Primary Examiner*—Stephen W. Smoot
(74) *Attorney, Agent, or Firm*—Rabin & Berdo, PC

(57) ABSTRACT

A silicon oxide film (12) and a silicon nitride film (13) are sequentially formed over a silicon substrate (11) having a plane orientation (100). A trench (14) is formed with the patterned silicon nitride (13) as a mask. Argon is ion-implanted from the direction normal to a plane orientation (111) of the interior of the trench (14), followed by formation of an oxide film.

13 Claims, 2 Drawing Sheets

METHOD OF DRY ETCHING SEMICONDUCTOR SUBSTRATE TO REDUCE CRYSTAL DEFECTS IN A TRENCH

BACKGROUND OF THE INVENTION

1. Field of the Invention

The present invention relates to a method of forming a device isolation trench, and particularly to a method of reducing crystal defects developed upon formation of shallow trench isolation (STI).

2. Description of the Related Art

A semiconductor device has constituent elements such as transistors, diodes, capacitors or resistors, etc. which are electrically separately arranged on a semiconductor substrate and interconnected with one another by wirings. A device isolation technique is the technique of principally physically isolating between these elements.

Upon device isolation, the planarization of the surface and simplification of a manufacturing process, or a possible reduction in device isolation width while a reduction in defect density is being performed, is desirable for the purpose of an improvement in device's characteristic, by extension, an increase in the performance of the semiconductor device and an improvement in its reliability.

The device isolation technique is roughly divided into LOCOS (Local Oxidation of Silicon) and STI (Shallow Trench Isolation). The LOCOS method for selectively oxidizing the surface of a semiconductor substrate through an insulating film is accompanied by the problem that a device forming region is corroded due to bird beaks and crystal defects occur due to the occurrence of local stress at the formation of a field oxide film.

On the other hand, the STI method is advantageous to micro-fabrication or miniaturization. Described specifically, the present STI method is one wherein a trench is formed in a device isolation region by RIE (Reactive Ion Etching) or the like and thereafter an oxide film that serves as an embedding material is deposited by, for example, a CVD (Chemical Vapor Deposition) method, and the oxide film deposited on a portion other than the trench is removed and planarized using CMP (Chemical Mechanical Polishing) or the like, thereby performing device isolation.

An STI forming method according to a prior art will now be explained specifically with reference to FIGS. 1 through 3. A silicon oxide film 2 and a silicon nitride film 3 are sequentially formed over a silicon substrate 1 by thermal oxidation (see FIG. 1). The silicon oxide film 2 and the silicon substrate 1 are sequentially etched with the silicon nitride film 3 as a mask by using photolithography technology and a dry etching method to thereby form a trench 4 (see FIG. 2).

Thereafter, rounding oxidation for rounding the edges of the trench 4 is performed. A CVD oxide film 5 is embedded into the trench 4 and planarized by CMP technology. Then, the silicon nitride film 3 and the silicon oxide film 2 each used as a mask film are removed by thermal phosphoric acid and hydrofluoric acid respectively. The embedded CVD oxide film 5 is heat-treated to form an STI isolation region (see FIG. 3).

However, the heat-treatment employed in the conventional STI forming method aims to suppress the occurrence of divots caused by the occurrence of densification of the embedded oxide film 5. It was however understood that since the plane orientation of a normally used silicon substrate was (100), crystal defects with, particularly, an plane orientation (111) as the inception at a trench bottom would occur after trench processing.

As principal factors for the occurrence of the crystal defects, there are considered one caused by crystal damage due to ion implantation done unintentionally, and one caused by thermal stress developed through an oxidizing process, an activating process, and a heat-treating process like an annealing process in a state in which a difference in dense density occurs between the qualities of oxide films embedded in trenches.

SUMMARY OF THE INVENTION

The present invention has been made to solve the foregoing problem. Therefore, the present invention aims to form a trench in a silicon substrate having a plane orientation (100) by dry etching, implant an ion species orthogonally to a plane orientation (111) of the bottom of the trench, effect sacrificial oxidation processing on an amorphous layer of silicon based on the ion implantation and remove the sacrificial silicon oxide film. Thereafter, oxidation processing is effected to form a trench formed with a silicon oxide film.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
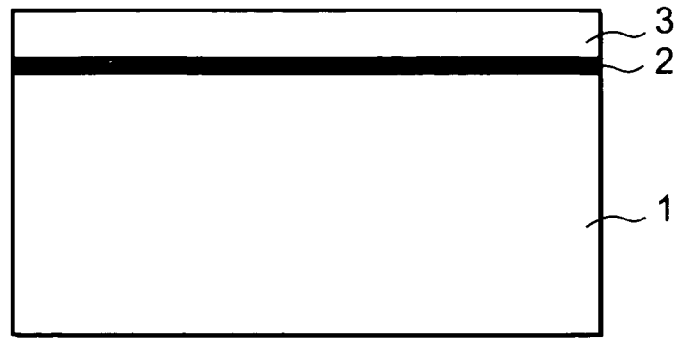
FIG. 1 is a process diagram showing a method of forming an STI device isolation region, according to a prior art.
Figure 2:
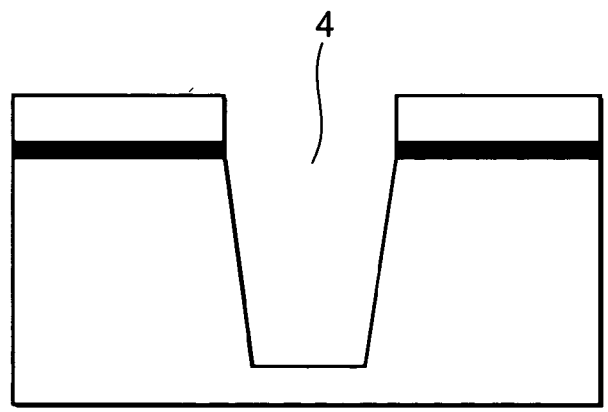
FIG. 2 is a process diagram following FIG. 1, illustrating the method of manufacturing the STI device isolation region, according to the prior art.
Figure 3:
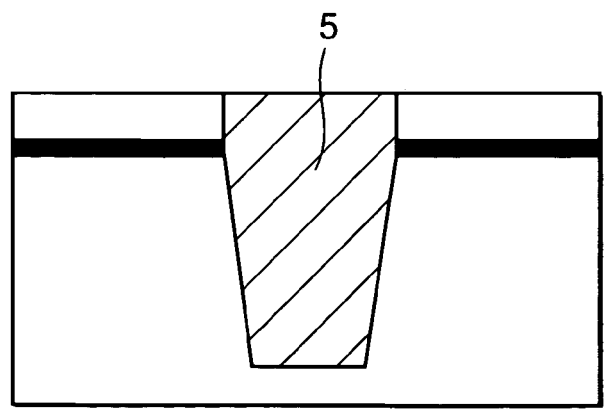
FIG. 3 is a process diagram following FIG. 2, showing the method of forming the STI device isolation region, according to the prior art.
Figure 4:
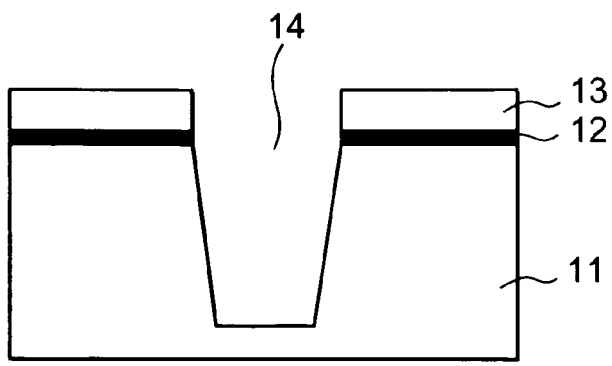
FIG. 4 is a process diagram illustrating a method of forming an STI device isolation region, according to the present invention.

A preferred embodiment of the present invention will be described with reference to FIGS. 4 through 7. A silicon oxide film 12 and a silicon nitride film 13 are sequentially formed over a silicon substrate 11 having a plane orientation (100) in a manner similar to the prior art. Thereafter, a trench 14 s formed with the silicon nitride film 13 as a mask by using photolithography technology and dry etching technology (see FIG. 4).

Figure 5:
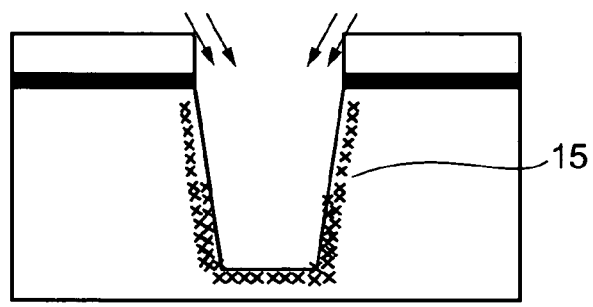
FIG. 5 is a process diagram following FIG. 4, showing the method of forming the STI device isolation region, according to the present invention.
Figure 6:
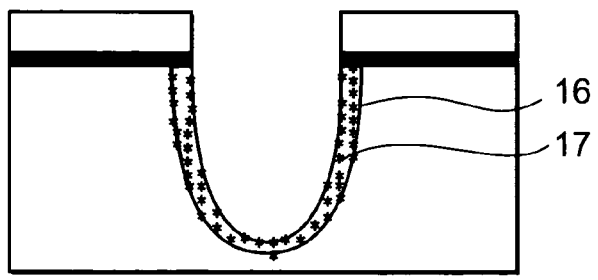
FIG. 6 is a process diagram following FIG. 5, depicting the method of forming the STI device isolation region, according to the present invention.
Figure 7:
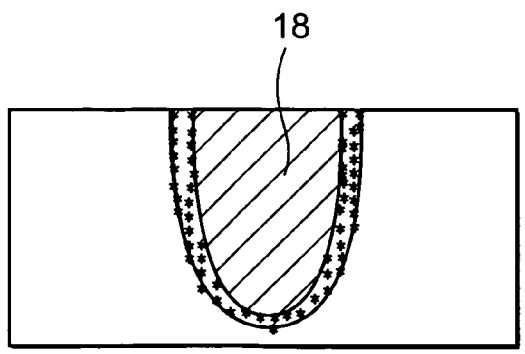
FIG. 7 is a process diagram following FIG. 6, showing the method of forming the STI device isolation region, according to the present invention.

Next, argon is ion-implanted in the direction normal to a plan orientation (111) of a trench bottom, which would occur after trench processing, i.e., at <111> orientation angles to give ion-collision-based damage to the plane orientation (111), thereby forming an amorphous layer 15 in the silicon substrate (see FIG. 5). At this time, the ion-implantation may preferably be carried out in such a manner that the ion-implanting angle becomes an angle as close to the normal to the plane orientation (111) as possible.

Ion species to be implanted may include electrically inactive ions such as inert gas elements or the like such as He, Ar, Kr, Xe and Rn as well as oxidation-accelerating ion species such as oxygen, fluorine, carbon, etc.

Next, the amorphous layer 15 formed on the inner wall of the trench 14 is subjected to oxidation treatment to form a sacrificial oxide film layer. The sacrificial oxide film layer is removed by wet etching using an HF solution or the like. Afterwards, re-oxidation based on wet oxidation for rolling up or rounding the edges of the trench 14 is carried out to form a liner layer (silicon oxide film) 16 (see FIG. 6).

At this time, crystal defects 17 at trench formation are apt to be taken or brought into the liner layer 16 due to the accelerating oxidation processing of the amorphous layer 15. Since the accelerating oxidation processing of the amorphous layer 15 is carried out, the difference in oxidation speed between the (100) plane and the (111) plane becomes small and hence stress developed due to the oxidation speed difference is reduced, thus reducing the occurrence of additional crystal defects.

In the subsequent process in a manner similar to the prior art, a CVD oxide film 18 is embedded into the trench 14 and thereafter planarized by CMP technology. Afterwards, the silicon nitride film 13 and the silicon oxide film 12 each used as a protective film are removed by thermal phosphoric acid and hydrofluoric acid respectively. The embedded silicon oxide film 18 is heat-treated to form an STI device isolation region (see FIG. 7).

According to the embodiment of the present invention as described above, it was possible to form an STI device isolation region low in leak current, which has reduced crystal defects due to the plane orientation (111) in particular, which would be developed after dry etching of the trench in the STI prior art and to form a high-reliable device.

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising the steps of sequentially:
   forming a trench in a silicon substrate by a dry etching method;
   implanting an ion species into a bottom portion of the trench;
   forming a sacrificial silicon oxide film inside the trench by execution of oxidation processing;
   removing the sacrificial silicon oxide film; and
   forming a silicon oxide trench-liner film;
   wherein the silicon substrate has a plane orientation (100); and
   wherein the implantation of the ion species is carried out from the direction normal to a plane orientation (111).

2. The method according to claim 1, wherein the ion species is inactive electrically to silicon.

3. The method according to claim 2, wherein the ion species is an ion species selected from He, Ar, Kr, Xe and Rn.

4. The method according to claim 2, wherein the ion-implanted element is an ion species that accelerates oxidation.

5. The method according to claim 4, wherein the ion species is an ion species selected from O, F and C.

6. A method of manufacturing a semiconductor device, comprising the steps of sequentially:
   forming a trench in a silicon substrate by a dry etching method;
   implanting an ion species into a bottom portion of the trench;
   forming a sacrificial silicon oxide film inside the trench by execution of oxidation processing; and
   wherein the silicon substrate has a plane orientation (100); and wherein the implantation of the ion species is carried out from the direction normal to a plane orientation (111).

7. The method according to claim 6, wherein the ion species is inactive electrically to silicon.

8. The method according to claim 7, wherein the ion species is an ion species selected from He, Ar, Kr, Xe and Rn.

9. The method according to claim 7, wherein the ion-implanted element is an ion species that accelerates oxidation.

10. The method according to claim 9, wherein the ion species is an ion species selected from O, F and C.

11. A method of manufacturing a semiconductor device, comprising the steps of sequentially:
    covering a surface of a silicon substrate with a silicon nitride film;
    forming a trench in the silicon substrate by a dry etching method;
    implanting an ion species into a bottom portion of the trench;
    forming a sacrificial silicon oxide film inside the trench by oxidation processing, using the silicon nitride film as a mask;
    removing the sacrificial silicon oxide film;
    forming a silicon oxide trench-liner film, using the silicon nitride film as a mask;
    embedding a silicon oxide material into the trench; and
    removing the silicon nitride film.

12. The method according to claim 11, comprising a step of covering the surface of the silicon substrate with a silicon oxide layer before the step of covering the surface with the silicon nitride film, wherein the silicon nitride film is formed on the silicon oxide layer.

13. The method according to claim 12, wherein the silicon oxide layer is formed by thermal treatment.

* * * * *